United States Patent [19]
Eschauzier

[11] Patent Number: 5,963,084
[45] Date of Patent: Oct. 5, 1999

[54] GM-C CELL WITH TWO-STAGE COMMON MODE CONTROL AND CURRENT BOOST

[75] Inventor: Rudolphe G. Eschauzier, Santa Clara, Calif.

[73] Assignee: Philips Electronics North America Corporation, New York, N.Y.

[21] Appl. No.: 09/143,835

[22] Filed: Aug. 31, 1998

Related U.S. Application Data

[62] Division of application No. 08/873,203, Jun. 11, 1997, Pat. No. 5,856,757.

[51] Int. Cl.[6] ........................................................ H03B 1/00
[52] U.S. Cl. ........................... 327/553; 327/552; 327/563
[58] Field of Search ................................... 327/552, 553, 327/558, 560, 563, 341, 345, 65, 67; 330/258; 375/103

[56] References Cited

U.S. PATENT DOCUMENTS

| | | | |
|---|---|---|---|
| 4,996,498 | 2/1991 | Hanna | 330/258 |
| 5,293,514 | 3/1994 | Nakagawara | 307/494 |
| 5,465,072 | 11/1995 | Atarodi | 330/254 |
| 5,570,049 | 10/1996 | Chen | 327/103 |
| 5,661,432 | 8/1997 | Chang et al. | 327/552 |
| 5,666,083 | 9/1997 | Myers et al. | 327/553 |
| 5,838,199 | 11/1998 | Nakamura | 330/258 |

FOREIGN PATENT DOCUMENTS 63-67905 A   3/1988   Japan .

*Primary Examiner*—Jung Ho Kim
*Attorney, Agent, or Firm*—Brian J. Weighaus

[57] ABSTRACT

A gm-C circuit includes a two-stage common mode control loop to limit the common mode voltage during circuit operation. To prevent latch-up in a cross-coupled differential gm-C type filter, the common mode control loop includes a circuit which provides extra current capability to the common-mode control loop without increasing the quiescent, current. This is accomplished by a current boost technique that provides large amounts of current when needed, while running in a low current mode under normal circumstances.

6 Claims, 3 Drawing Sheets

GM-C CELL WITH TWO-STAGE COMMON MODE CONTROL AND CURRENT BOOST

CROSS REFERENCE TO RELATED APPLICATIONS

This is a divisional of application Ser. No. 08/873,203 filed Jun. 11, 1997, U.S. Pat. No. 5,856,757.

BACKGROUND OF THE INVENTION

1. Field of the Invention

The invention relates to filters implemented in integrated circuits. More particularly, the invention relates to an improvement in the common mode control loop of a gm-C cell circuit. The invention also relates generally to a control circuit for controlling the voltage of an output signal in a second circuit.

2. Description of the Prior Art

Gm-C circuits are widely used to implement tunable, integrated continuous-time filters. Such filters are used in a wide range of products including communication products. For example, in cellular phones, integrated continuous-time filters are used for reconstruction of signals received by the receiver and anti-aliasing of signals to be transmitted.

The basic elements of a gm-C filter are show in FIG. 1. It is an integrator 100 that includes two circuit branches 100a, 100b each including an electronically adjustable transconductor 110 driving an integrating capacitor Ci. The two branches are coupled in parallel between a first voltage source Vdd and a second, lower voltage source, such as ground. Branch 100a includes current source I2 feeding current to the collector of a cascode bipolar transistor Q2 having its emitter connected to the drain of an input NMOS FET device M2. The source of device M2 is coupled to ground. Branch 100b includes current source I1 feeding cascode bipolar device Q1 which is connected in series with MOS FET device M1 in the same manner as devices Q2, M2 in branch 100a. The devices M1, M2 each have a control gate receiving, respectively, an input signal in+, and its inverse, in−.

Input devices M1 and M2 operate in their triode regions with a fixed drain-source voltage "Vds", set by the cascodes Q1 and Q2 and the tuning voltage Vtune applied to the bases of the cascode devices Q1, Q2. Under these conditions, the collector currents of devices Q1 and Q2 are to the first order linearly dependent on the respective input voltages (in+, in−) applied to the gates of input devices M1, M2, realizing a linear transconductance. The value of this transconductance can be controlled by adjusting the tuning voltage Vtune, which through cascodes Q1 and Q2, sets the drain-source voltage Vds of the devices M1 and M2. In general, MOSFET's M1, M2 function as variable resistors, controlled by input signals in+, in−. The integrating capacitor Ci converts, or integrates, the current in branches 100a, 100b to avoltage signal, which is output at the respective outputs out− and out+. Typically, the tuning voltage Vtune is derived on-chip from an input signal with a well-known frequency. This fixes the absolute frequency response of the integrated filter.

The basic circuit of FIG. 1 cannot be practically used unless the common-mode voltage at the output (out−, out+) of the gm-C cell is controlled. One known implementation of a common-mode control circuit is shown in FIG. 2. The common mode control circuit 150 includes sense resistors R1 and R2, which measure the common-mode component of the output voltage across integrating capacitor Ci. A differential pair, formed by bipolar devices Q3 and Q4, serves as a control amplifier. Two voltage buffers VB1 and VB2 are couped, respectively, between opposite sides of integrating capacitor Ci and the respective resistors R1, R2. The voltage buffers prevent loading of the gm-C cell 100 by the resistors R1 and R2. The common mode control circuit further includes a reference voltage source Vref and a current mirror formed by PMOS FET devices M3, M4, and MS. The current mirror supplies current to the branches 100a, 100b under control of the differential amplifier.

The common mode control circuit 150 operates as follows. The voltage Vcm at the base of bipolar device Q3 represents the common-mode voltage at the output of the integrator 100. The differential pair Q3, Q4 compares voltage Vcm to a reference voltage Vref presented to the base of transistor Q4. When voltage Vcm differs from the voltage Vref, the current through the devices Q3, R3 will differ from the current through the devices Q4, R4. This difference in current drives the current mirror circuit, consisting of PMOS FETs M3, M4 and M5, until the output common-mode voltage Vcm equals Vref. When the voltage Vcm is greater than Vref, the current through transistor Q3 is greater than through transistor Q4. This causes the gate-source voltage of diode M5 to increase, also increasing the gate-source voltage of transistors M3 and M4. Consequently, the current through M3 and M4 will become greater. When the voltage Vcm is less than the voltage Vref, the current through transistor Q4 is greater than that through transistor Q3. This causes the gate-source voltage of diode M5 to decrease, also decreasing the gate-source voltage of transistors M3 and M4. Consequently, the currents through M3 and M4 will become smaller.

High demands are posed on the common-mode feedback loop 150. This is caused by the fact that the two grounded triode-mode devices M1 and M2 of the integrator provide no common-mode rejection of the input signal in+, in−. Common-mode signals are amplified by the same amount as differential-mode signals. Therefore all of the common-mode rejection between the input and the output of the gm-C cell must be generated by the common-mode feedback loop. As will be discussed, for most filter applications the common-mode rejection ratio has to be higher than unity in order for the filter not to latch-up. To achieve this with the circuit of FIG. 2, the gain of the common-mode control loop has to be higher than the differential gain from the input to the output of the Gm-C cell.

Although it is usually not particularly difficult to achieve this high loop gain DC wise, this is not necessarily so AC wise. The high gain of the common-mode feedback loop moves up its 0 dB frequency, complicating the task of ensuring sufficient phase margin for stability. One compensating measure taken in the prior art circuit of FIG. 2 is supplying a constant portion of the collector currents of transistors Q1 and Q2 by the separate current sources I1 and I2, instead of burdening the current mirror circuit of devices M3–M5 with the task of providing all the current. This helps to keep the currents through devices M3 and M4 small, moving up their parasitic poles.

To illustrate the importance of common-mode rejection for filter applications, FIG. 3 shows a basic resonator circuit built up around two cross-coupled Gm-Cells 200, 210. The inputs 201, 202 and 211, 212 of the two Gm-C cells 200, 210 correspond to the inputs in+, in−of FIG. 2. Similarly, the outputs 203, 204 and 213, 214 correspond to the outputs out−, out+of the Gm-C cell of FIG. 2. The output 214 of cell 210 is cross-coupled to the input 201 of cell 200 and the inverted output 213 of the cell 210 is cross-coupled to the inverted input 202 of the cell 200. This cross-coupling ensures that for differential-mode signals the polarity of the feedback is negative. For common-mode signals, however, the cross-coupling has no effect, resulting in positive feedback. To guarantee stability of this positive feedback loop, the total common-mode gain has to be lower than one. This condition is satisfied only when each cell 200, 210 provides sufficient common-mode rejection.

Although the prior art circuit of FIG. 2 under normal conditions is capable of delivering adequate common-mode rejection, this situation changes with large signal excursions at the input. In that case, the common-mode control loop can move out of its linear operating region, reducing the open-loop gain to nearly zero.

Unfortunately, this situation is difficult to prevent. The reason is that the two input devices M1 and M2 (see FIG. 2) have their sources tied to ground, and therefore are capable of conducting large amounts of current when their input signals are high. The drain current of each of the devices M1, M2 is limited only by the maximum gate voltage, Which equals Vdd. Thus, for example, or a high input signal equal to Vdd at the inputs 211, 212 of the second cell 210, the devices Q1, M1 and Q2, M2 in each branch 100a, 100b (FIG. 2) will tend to draw a large current. Once the drain current in the devices M1, M2 exceeds the maximum current that the common-mode control circuit 150 can provide, PMOS devices M3 and M4 of tne current mirror circuit will not be able to pull us the output voltages out− and out+ to their desired common-mode levels, as set by the reference voltage Vref. The result is that the output nodes 213, 214 of cell 210 are pulled all the way down to ground.

Since the outputs of one Gm-C cell drives the inputs of the following Gm-C cell, as indicated by FIG. 3, the inputs 201, 202 of the cell 200 will also be grounded when the outputs 213, 214 of the cell 210 are pulled low, causing the input devices M1, M2 of cell 200 to turn off. This causes a latch-up situation, because the current sources I1 and I2 have no path to ground and will rail the outputs 203, 204 of the cell 200 to Vdd. This high output voltage at outputs 203, 204 in turn enforces the high input condition at inputs 211, 212 of the following Gm-C cell 210. Thus, the high input condition at inputs 211, 212 are latched high if the common-mode control loop is unable to provide sufficient current to keep the common-mode current at the desired level in response to high input signals to one the Gm-C cells.

The maximum pull-up current of the common-mode control loop 150 in FIG. 2, apart from the current sources I1 and I2, is set by the constant current source "Itcm" of the common-mode control amplifier and the input-output current-ratio of the current mirror M3–M5. Although it is theoretically possible to increase the tail current providing the source and Itcm to such a value that even under worst case conditions the common-mode loop will always be able to source enough current to prevent latch-up, in practice the required current will become unacceptably large.

FIG. 4 shows a known circuit which prevents latch-up by adding inherent common-mode rejection to the path extending from the input of the Gm-C cell to the output. Circuit elements corresponding to those in FIG. 2 have the same legends. Added to the circuit of FIG. 2 is a differential amplifier 175 with a high common-mode rejection. Common-mode rejection is achieved at this point with a differential pair at the input of the amplifier 175. The addition of the differential amplifier 175 dictates the use of two integrating capacitors Ci1, Ci2 instead of the single integrating capacitor Ci of FIG. 2. Both capacitors are connected across the differential amplifier. In this configuration, capacitors Ci1 and Ci2 each must have twice the value of the capacitor Ci in the circuit of FIG. 2 for the circuit of FIG. 4 to achieve the same transfer characteristics as that in FIG. 2.

Although the solution of FIG. 4 prevents latch-up, it also adds to the complexity and size of the circuit. Not only do the components for the differential amplifier 175 have to be added, but also the total capacitance has quadrupled. Furthermore, the current consumption of the added amplifier stretches the usually already-tight power budget of many applications, especially those relying on battery power, such as in mobile phones.

SUMMARY OF THE INVENTION

Accordingly, it would be desirable to have a Gm-C cell with a common-mode control circuit which prevents latch-up, does not increase the capacitance of the integrator circuit, does not significantly increase the size or complexity of the cell and does not significantly increase the current consumption of the cell.

Generally speaking, a filter circuit according to the invention includes an integrating circuit, including an input and an out-put, for integrating an input signal received at said input and for outputting the integrated input signal at said output. The output signal has a common mode voltage ranging between a first voltage supply and a second, lower voltage supply. The filter circuit includes a common mode control circuit coupled to the integrating circuit which senses the common mode output voltage of the integrating circuit and supplies current to the integrating circuit to maintain the common mode voltage at a preselected level. The common mode control circuit includes a first circuit portion, or stage, which supplies current up to a first current level to maintain the common mode voltage at the preselected level in response to a first range of input signals having an upper voltage level. A second circuit portion provides additional current to the integrating circuit when the input signals have a magnitude higher than the upper voltage level of the first range of input signals.

This two stage controls enables optimization of the common mode control during operation with input signals in a normal, first range, while still maintaining control in response to input signals excursions above the upper voltage level of the first range. Since the first circuit portion need not supply large current during operation, it can be optimized to draw small current.

In an embodiment, the first circuit portion senses the common mode output voltage of the integrator and compares via a differential amplifier to a reference voltage corresponding to the desired level of the common mode voltage. The differential amplifier includes a first transistor with a control input for receiving the sensed common mode voltage component, the first transistor being rendered non-conductive when the common mode output voltage is at or near the lower supply voltage, and the seconds circuit portion supplies the additional current when the first transistor is rendered non-conductive. With this arrangement, the second stage supplies additional current when the common mode output voltage drops due to the current supplied by the first stage being insufficient to maintain the common mode voltage at the preselected level. Thus, activation of the second stage to provide additional current is accomplished without separate sensing of the input voltages, simplifying circuit design. The activation of the second stage also occurs only when necessary to avoid latch-up, i.e., when the output signal approaches the lower voltage supply level.

The common mode control circuit includes a current mirror which supplies the current to the integrating circuit. current mirror includes a control transistor and supplies current in proportion to the current flowing through the control transistor. In a favorable embodiment, the first and second circuit portions are coupled to control the current through said control transistor, thereby avoiding additional current supply circuitry for the second stage.

Favorably, the second circuit provides a current boost action. In an embodiment, the second circuit portion includes a current source providing a constant current and a boost device, coupled to the constant current source, for boosting the current through the integrator circuit by an amount substantially greater than the constant current from the current source. This has the advantage that the first circuit portion can be designed to draw a small amount of current while the input signals are in a normal range, while extra current is drawn only when the second circuit functions to provide the substantially greater current to prevent the output signal from being pulled down to the lower voltage supply as a result of input signals higher than the normal first range.

The circuit according to the invention has particular advantages when used in filter circuits including cross-coupled gm-C cells. In such a filter, the previously described latch-up is avoided by keeping the output signal from being pulled to the lower voltage supply by a large input signal when the first stage is unable to provide sufficient current to the integrator circuit. The second stage of common mode control provides a relatively simple circuit which provides the additional current boost only when needed.

The two stage current-supply sub-circuit which forms part of the Gm-C cell according to the invention may also be used to supply current to circuits other than the integrator circuit shown. The two-stage circuit with boost action may be used wherever it is necessary to supply current to a circuit to control its output.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
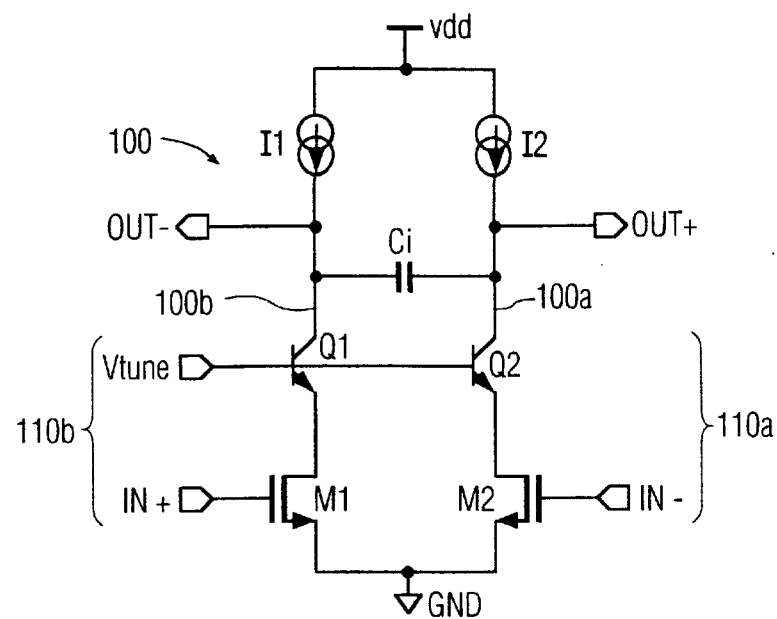
FIG. 1 shows a Gm-C integrator for implementation of a tunable integrated continuous time filter.
Figure 2:
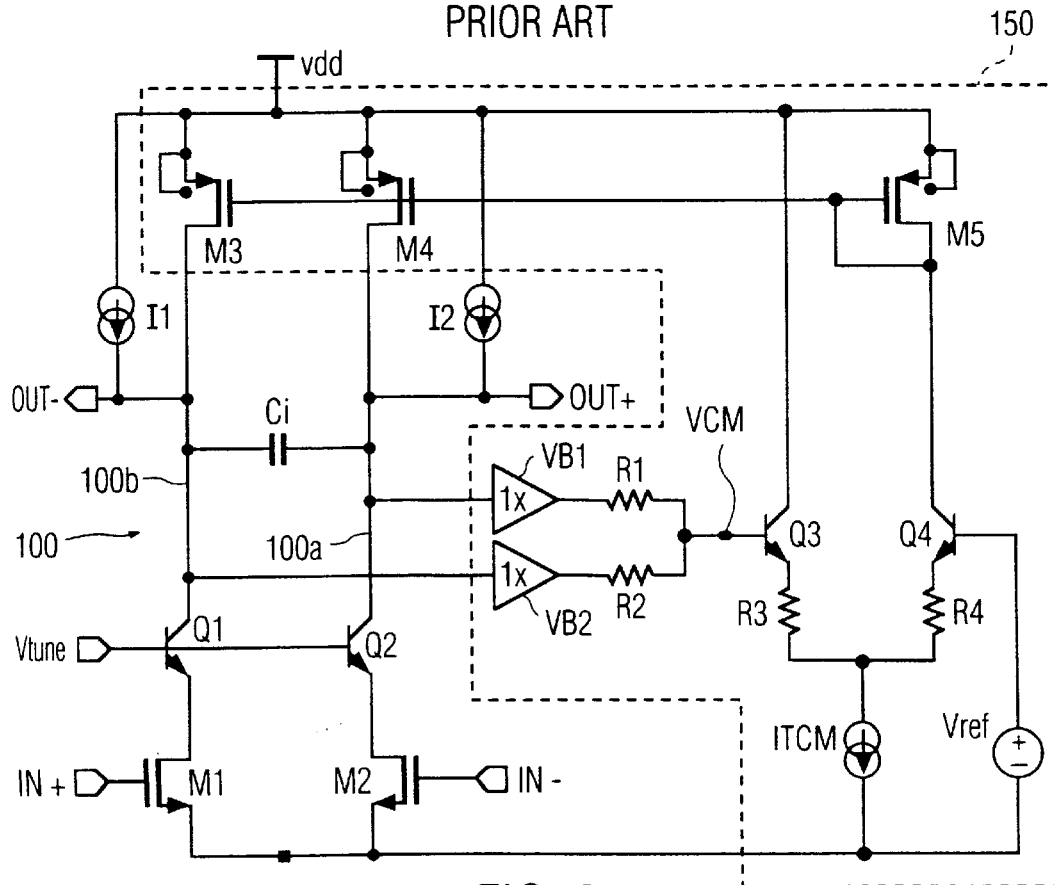
FIG. 2 shows the Gm-C Integrator or FIG. 1 with the addition of a common-mode control circuit.
Figure 5:
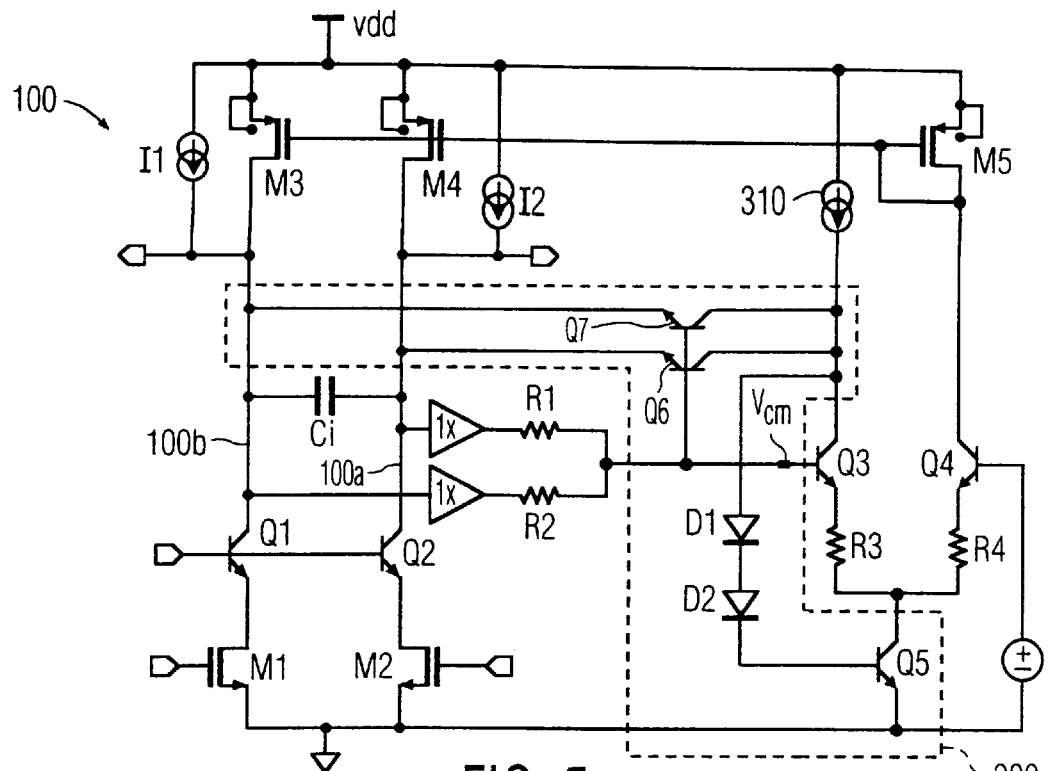
FIG. 5 shows the Gm-C cell according to the invention with a current boost feedback circuit for the common mode control circuit.

FIG. 5 shows the gm-C cell circuit according to the invention which includes a current boost feedback circuit 300 added to the common mode control circuit 150. Elements corresponding to those of FIG. 2 have the same legends. Since the operation of the basic integrator circuit and of the common-mode control was already explained with reference to FIG. 2, only the additional circuitry according to the invention and its cooperation with the circuit elements of the common mode control circuit 150 and of the integrator 100 will be explained in detail.

Generally speaking, the current boost feedback circuit 300 increases the tail current of the differential pair Q3, Q4 as needed. This greatly increase the allowable range of the common-mode portion of the input signal without causing latch-up. With circuit 300, the input voltage signal can now include the positive supply rail Vdd without using excessive current in the common-mode control under normal conditions.

In a first embodiment, the current boost feedback circuit includes a first current source 310, a bipolar transistor Q5, diodes D1 and D2, and transistors Q6 and Q7 for saturation detection of transistor Q3. The boost transistor Q5 has its collector connected to a common node of resistors R3 and R4, at their ends remote from transistors Q3 and Q4, while the emitter of transistor Q5 is connected to the second, lower voltage supply, in this case ground. The base of device Q5 is coupled to the collector of transistor Q3 via diodes D1 and D2. The anode of diode D1 is connected to the collector of device Q3, the cathode of the diode D1 is connected to the anode of diode D2, and the cathode of diode D2 is connected to the base of transistor Q5. The transistors Q6 and Q7 have their bases and collectors tied, respectively, to the base and collector of transistor Q3. The emitter of transistor Q7 is connected to one side of the integrating capacitor Ci while the emitter of the transistor Q6 is connected to the other side of the capacitor Ci.

Figure 4:
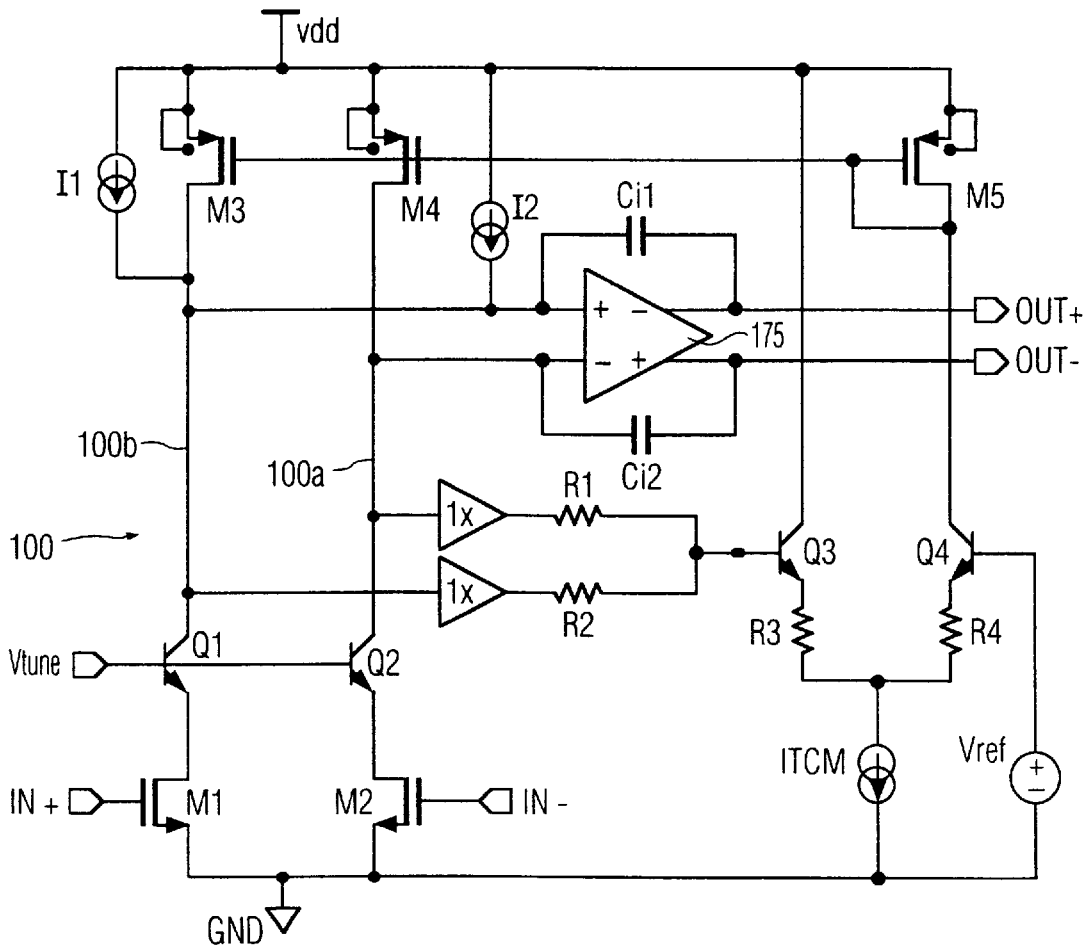
FIG. 4 shows a known Gm-C cell for use in the differential resonator filter circuit, with added common-mode rejection.

The current boost feedback circuit operates as follows. Assuming that the common mode control circuit 150 reaches an equilibrium state, the voltages at the two inputs of the differential pair Q3, Q4 will be equal, i.e. Vcm will equal Vref. In that case the collector currents of devices Q3 and Q4 will also be equal. The current source 310 is set to provide a constant current to the collector of transistor Q3 of one-half the desired quiescent tail current Itcm of the differential pair Q3, Q4, i.e. source 310 provides a current of Itcm/2. Since the collector current of Q3 is set to Itcm/2, the collector current of Q4 will also be Itcm/2 when the voltage Vref equals the voltage Vcm. The total current running through bipolar device Q5 in the equilibrium state is therefore Itcm (disregarding base currents in transistors Q3, Q4). Thus, the circuit of FIG. 4 achieves the same quiescent tail current with a current source 310 which provides half of the current provided by the current source Itcm of FIG. 2.

That the circuit indeed reaches this equilibriuam state can be seen from the feedback set up by the two diodes D1 and D2 and transistor Q5. If the collector current of device Q5 is too low, the current source 310 will pull up the collector voltage of bipolar device Q3. This, in turn, through the DC levelshift provided by the diodes D1 and D2, causes the base-emitter voltage Vbe of transistor Q5 to increase, pulling down the collector voltage of device Q3 again. Equilibrium is reached when the collector voltage of transistor Q3 is approximately 3 diode voltages above ground.

Figure 3:
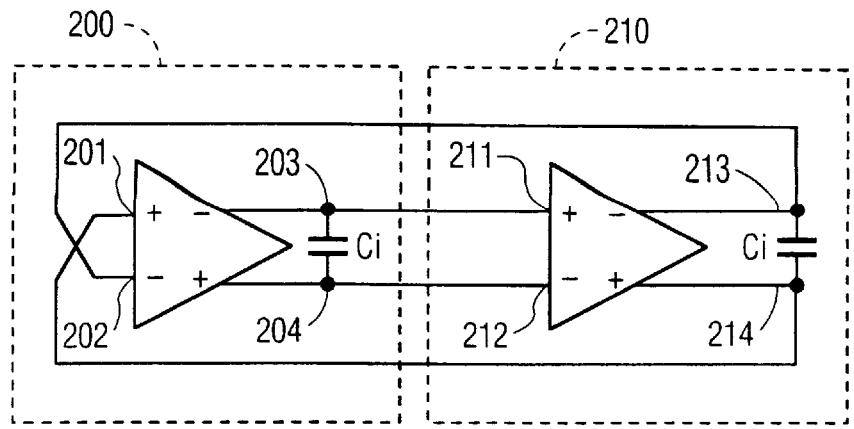
FIG. 3 shows a basic two-integrator differential resonator filter circuit.

The current boost action of circuit 300 occurs when the inputs in− and in+ of the Gm-C cell are pulled up to the positive supply voltage Vdd. In that case the output voltages out− and out+ will, as previously explained with reference to FIGS. 2, 3, be pulled down to ground, which, through the voltage buffers VB1, VB2 and resistors R1 and R2, unbalances differential pair Q3, Q4 causing transistor Q3 to turn off and device Q4 to turn fully on. In this situation, transistor Q3 does not provide a current path for the current Itcm/2, which will now flow into the base of Q5 via the diodes D1 and D2. This base current will get beta multiplied, increasing the collector current of device Q5 from Itcm to a maximum of ($\beta$/2)*Itcm. It is this beta multiplied current that, through transistor Q4 and the current mirror circuit M3–M5, pulls up the output voltages out– and out+ of the Gm-C cell back to its intended common-mode value (set by reference voltage Vref). Because of the current boost action, the quiescent tail current Itcm running through transistor Q5 can be $\beta$/2 times smaller than the same current in FIG. 2, which amounts to approximately a factor of 50. Accordingly, this circuit provides significant power savings over the prior art circuit.

Although the currents in the common-mode control circuit 150 vary considerably during the current boost phase, the gain of circuit 150, which is critical for stability of the common mode control circuit, is kept relatively constant. This is due to the two emitter degeneration resistors R3 and R4. These resistors limit the transconductance of the differential pair Q3, Q4 at high currents, and keep the total gain of the circuit 150 at a desired level based on the selection of the resistance values of the resistors R3, R4.

One addition to the circuit of FIG. 5 not discussed so far are the two saturation detectors Q6 and Q7. These serve to prevent another latch-up situation wherein the base voltage of transistor Q3 is high enough for the collector-base junction of transistor Q3 to become forward biased. In that case the base-collector current of transistor Q3 would get added to the base current of transistor Q5, also increasing its collector current. The extra current would then pull un the output voltages out– and out+, through transistor Q4 and the current mirror circuit. This would result in latch-up, since a high output voltage is what caused the collector-base junction of device Q3 to become forward biased in the first place.

The effect of the saturation detection transistors Q6 and Q7 is to pull down the output voltages out– and out+, and thus the base voltage of transistor Q3, at the onset of saturation of transistor Q3. The two transistors Q6 and Q7 are operated in their reversed modes, where the collector becomes emitter and vice verse, to accurately match the collector-base junction of transistor Q3.

Figure 6:
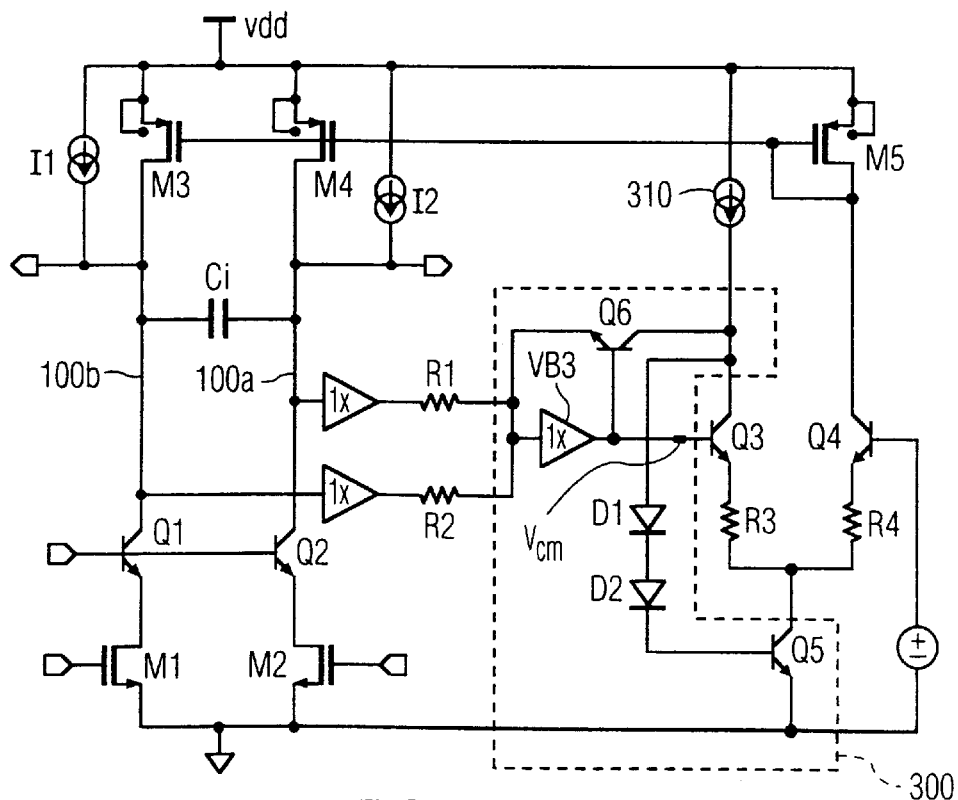
FIG. 6 shows a Gm-C cell with to another embodiment of the current boost feedback circuit according to the invention.

An alternative way to implement the saturation detection is shown in FIG. 6, in which the transistor Q7 of FIG. 5 is deleted. A voltage buffer VB3 is added, connected between the base of switch Q3 and a common node coupling the resistors R1 and R2. This circuit saves one saturation detecting transistor at the expense a an additional voltage buffer to drive the base of Q3. In this configuration, it suffices for the saturation detection transistor to pull down the common node of the two resistors R1, R2, instead of having to pull down both outputs out+, out– of the integrator circuit.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by tne appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A combination, comprising:
   a first circuit including an input which receives an input signal and an output which outputs an output signal, said first circuit being characterized by the output signal having a voltage ranging between and including a first voltage level and a second, lower voltage level,
   a second circuit for supplying current to said first circuit up to a first current level to maintain the output voltage of said first circuit below said first voltage level when said input signal is below a third voltage level;
   for a given voltage of said input signal, said output voltage of said first circuit increasing with increasing current supplied to said first circuit, and for an input signal at or above said third level, said output voltage being pulled down to said second, lower voltage level when said current supplied by said second circuit is at said first current level; and
   a third circuit coupled to said second circuit for providing, in addition to the current of the first current level, to said first circuit only when said input signal has a voltage at or above said third level.

2. A combination according to claim 1, wherein:
   said second circuit includes a first transistor with a control input for receiving a signal corresponding to the voltage of the output signal of the first circuit, said first transistor being rendered non-conductive when the voltage of the output signal is at or near said lower voltage level, and
   said third circuit provides said additional current when said first transistor is rendered non-conductive.

3. A combination according to claim 2, wherein:
   said second circuit includes a current mirror circuit supplying current to said first circuit, said current mirror circuit including a control transistor and supplying current to said first circuit in proportion to the current flowing through said control transistor; and
   said third circuit is coupled to control the current through said control transistor.

4. A combination according to claim 3, wherein:
   said third circuit includes a current source providing a constant current and boost means, coupled to said constant current source, for boosting the current through said control transistor of said current mirror circuit by an amount substantially greater than said constant current from said current source.

5. A combination, comprising:
   a first circuit including an input which receives an input signal and an output which outputs an output signal, said first circuit being characterized by the output signal having a voltage ranging between and including a first voltage level and a second, lower voltage level,
   a second circuit for supplying current to said first circuit up to a first current level to maintain the output voltage of said first circuit below said first voltage level when said input signal is below a third voltage level;
   for a given voltage of said input signal, said output voltage of said first circuit increasing with increasing current supplied to said first circuit, and for an input signal at or above said third level, said output voltage being pulled down to said second, lower voltage level when said current supplied by said second circuit is at said first current level; and a third circuit coupled to said second circuit for providing additional current in addition to the current of the first current level, to said first circuit only when said input signal has a voltage at or above said third level, said third circuit including a current source providing a constant current and boost means, coupled to said current source, which boost means together with the second circuit provides the additional current.

6. A combination according to claim 5, wherein said combination resides on an integrated circuit.

* * * * *